United States Patent
Cho

(10) Patent No.: US 7,019,316 B2
(45) Date of Patent: Mar. 28, 2006

(54) HIGH-ENERGY ION IMPLANTER AND METHOD OF OPERATION THEREOF

(75) Inventor: Yeon-Ha Cho, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/016,246

(22) Filed: Dec. 20, 2004

(65) Prior Publication Data

US 2006/0011866 A1    Jan. 19, 2006

(30) Foreign Application Priority Data

Jul. 15, 2004    (KR) ............... 10-2004-0055109

(51) Int. Cl.
*H01J 37/317*    (2006.01)

(52) U.S. Cl. .................. 250/492.21; 250/492.21; 250/281; 250/282

(58) Field of Classification Search ............ 250/492.21
See application file for complete search history.

(56) References Cited

U.S. PATENT DOCUMENTS 6,462,331 B1 *  10/2002  Choi et al. .................. 250/251
6,815,666 B1 *  11/2004  Schroeder et al. ........... 250/281
2004/0251432 A1 *  12/2004  Sano et al. ............. 250/492.21

FOREIGN PATENT DOCUMENTS

| JP | 2000-124148 | 4/2000 |
|---|---|---|
| KR | 2002-0032762 | 5/2002 |
| KR | 2002-0083601 | 11/2002 |

* cited by examiner

*Primary Examiner*—Nikita Wells
*Assistant Examiner*—Jennifer Yantomo
(74) *Attorney, Agent, or Firm*—Volentine Francos & Whitt PLLC

(57) ABSTRACT

A high-energy ion implanter monitors the recycling of a charge exchanging gas that is supplied to a stripper of a tandem accelerator. When the charge exchanging gas leaks out from the stripper and then flows into both energy boxes adjacent the tandem accelerator, gas sensors in the energy boxes measure the amount of the charge exchanging gas and send corresponding data to a controller. The controller compares the measured data with a standard data on the charge exchanging gas. When the measured data is different from the standard data, a pre-established interlocking system breaks off the operation of the implanter.

10 Claims, 4 Drawing Sheets

HIGH-ENERGY ION IMPLANTER AND METHOD OF OPERATION THEREOF

BACKGROUND OF THE INVENTION

1. Field of the Invention

The present invention generally relates to the fabrication of semiconductor devices. More particularly, the present invention relates to a high-energy ion implanter.

2. Description of the Related Art

In the fabrication of semiconductor devices, an ion implanter is used to modify surface properties of, for example, a semiconductor wafer. More specifically, the ion implanter ionizes dopant atoms and accelerates them to a high speed. Then, a beam of the ions is swept across the wafer surface. The ions penetrate portions of the wafer that are left exposed by a mask. The amount of dopant and the depth of penetration are governed by the size of the dopant atoms, the velocity of the ions, and the amount of time the wafer is exposed to the beam.

An ion implanter may be classified as a medium-current ion implanter, a high-current ion implanter, or a high-energy ion implanter. The medium-current ion implanter generates a beam having a maximum current of about 2 mA at a maximum acceleration energy of about 250 keV. A high-current ion implanter generates a beam having a maximum current of about 20–30 mA and can implant ions at a concentration of about $10^{14}$ ions/cm$^2$. A high-energy ion implanter may generate a beam having an energy level of up to several MeV. The high-energy ion implanter helps minimize production costs because its use does not require some conventional processes, such as the masking of the wafer, to be performed. Also, semiconductor devices manufactured through the use of a high-energy ion-implanter exhibit relatively low levels of junction leakage and improved latch-up characteristics. Thus, the production yield is high with respect to an ion implantation process carried out by a high-energy ion implanter. Therefore, high-energy ion implanters are gradually becoming more widely used for implanting ions in a semiconductor device manufacturing process.

FIG. 1 schematically shows a conventional high-energy ion implanter 300. The conventional high-energy ion implanter 300 includes an ion source 321, a vaporizer cell 323, a 110° analyzer magnet 325, and a pre-accelerator (not shown). The conventional high-energy ion implanter 300 further includes a low-energy accelerator 331, a stripper 333, a high-energy accelerator 335, a turbo pump (not shown in the figure), a 10° analyzer magnet 341, and an end station 343.

The ion source 321 creates positive ions from gases that comprise atoms of the desired dopant such as boron (B) or phosphorus (P). The vaporizer cell 323 converts the ionic polarities of the positive ions created in the ion source 321 into desired polarities by using magnesium (Mg). The 110° analyzer magnet 325 separates out only negative ions from the polarized ions. The pre-accelerator applies a proper voltage to the negative ions and thereby accelerates the negative ions.

The low-energy accelerator 331 draws the accelerated ions to a high voltage electrode and then accelerates the ions again for smooth polarity conversion. The stripper 333 removes electrons from the negative ions by making the ions collide with a charge exchanging gas in a vacuum, whereby the negative ions are converted into positive ions. The high-energy accelerator 335 further accelerates the positive ions. The turbo pump creates a vacuum in the stripper 333 and circulates the charge exchanging gas. The 10° analyzer magnet 341 filters the ion beam, accelerated by the high-energy accelerator 335, in an electrostatic manner. The end station 343 implants the ion beam passing through the 10° analyzer magnet 341 into a wafer. The low-energy accelerator 331, the stripper 333 and the high-energy accelerator 335 constitute a tandem accelerator 330.

As discussed above, the ions of the ion beam created in the ion source 321 are in a positive state, and then the ionic polarity of the ion beam is converted in the vaporizer cell 323. The negative ions are separated out in the 110° analyzer magnet 325 and then are directed to the pre-accelerator. In the pre-accelerator, the negative ions are accelerated to a desired energy, e.g., 100 keV, and then are accelerated again in the low-energy accelerator 331 of the tandem accelerator 330. While passing through the stripper 333, the negative ions are deprived of electrons by the charge exchanging gas supplied from the turbo pump and are thereby converted into positive ions. The positive ions are accelerated in the high-energy accelerator 335 and then filtered by the 10° analyzer magnet 341. Finally, the beam of positive ions is implanted into the wafer 10 in the end station 343.

FIG. 2 schematically shows the tandem accelerator 330 of the conventional high-energy ion implanter 300. FIG. 3 is an enlarged view of the stripper 333 of the tandem accelerator 330. Referring to FIGS. 2 and 3, the tandem accelerator 330 includes the low-energy accelerator 331, the stripper 333 and the high-energy accelerator 335 arranged in series and provided within an accelerating tank 351. A high voltage driver 352 and a high voltage multiplier 353 are provided in the upper portion of the tandem accelerator 330 in order to impress a high voltage, e.g., a voltage of 650 keV or 750 keV, across the stripper 333.

The turbo pump 337 is provided under the stripper 333 and supplies the charge exchanging gas to the stripper 333. Furthermore, the charge exchanging gas circulates between the turbo pump 337 and the stripper 333. A dynamo 338 supplies power for driving the turbo pump 337. Because a state of high voltage, e.g., 750 keV, prevails in the accelerating tank 351, the dynamo 338 preferably uses the rotational output of a motor to prevent electric sparks from being produced.

As discussed above, the negative ions are converted into positive ions while passing through the stripper 333. The stripper 333 contains the charge exchanging gas, e.g., $N_2$ or Ar, which reacts with the negative ions and then removes electrons from the negative ions. The resultant positive ions are accelerated in the high-energy accelerator 335, obtaining an additional energy of 650 keV or 750 keV, and thereby attain a high energy of about 1.5M eV.

A low-energy box 361, having a low-energy quadrupole 327 and a low-energy faraday cup 326, is provided at a front end of the accelerating tank 351. In addition, a high-energy box 371 having a high-energy quadrupole lens 340 is provided at the rear end of the accelerating tank 351. The low-energy quadrupole 327, the low-energy faraday cup 326, and the high-energy quadrupole lens 340 serve to focus the ion beam. The low-energy box 361 and the high-energy box 371 also each have a vacuum gauge 381 for measuring the pressure in the box. To this end, each vacuum gauge 381 is capable of measuring high negative pressures.

However, in the conventional ion implanter 300, the charge exchanging gas may flow into the low-energy box 361 and/or the high-energy box 371 due to a malfunction of the turbo pump 337. Such charge exchanging gas may cause an unfavorable rise in the pressure in the low-energy box 361 and/or the high-energy box 371, and may affect the focusing of the ion beam. In that case, the ion beam may collide with electrodes 332 and 336 of the tandem accelerator 330 and lateral walls of the stripper 333. This, in turn, may create contamination, cause accidents and may otherwise adversely impact the reliability of the ion implantation process.

In order to prevent such problems, a conventional high-energy ion implanter 300 not only uses the high vacuum gauges 381 to measure the pressure in the tandem accelerator 330, but also uses sensors to monitor the current, frequency and temperature of the dynamo 338 that drives the turbo pump 337. Accordingly, it is possible to ascertain whether the charge exchanging gas is being circulated properly.

However, the vacuum gauges 381 are only capable of revealing remarkable changes in vacuum pressure. Moreover, the current, the frequency and the temperature of the dynamo 338 may vary with ion implantation conditions. Thus, the sensors may not reveal a slight deviation in the operation of the turbo pump 337 from the intended state of operation. Additionally, monitoring only the turbo pump 337 and associated hardware operation makes it nearly impossible to ascertain whether the charge exchanging gas is flowing into the low-energy box 361 and/or the high-energy box 371 and hence, does not allow for a determination to be made as to whether such an inflow of the charge exchanging gas is affecting the focusing of the ion beam.

SUMMARY OF THE INVENTION

An object of the present invention is to provide a high-energy ion implanter, and method of operation thereof, in which even slight malfunctions in a tandem accelerator thereof can be sensed.

More specifically, an object of the present invention is to provide a high-energy ion implanter, and method of operation thereof, in which the recycling of a charge exchanging gas that is supplied to a tandem accelerator to change the ionic polarity of an ion beam is monitored.

According to one aspect of the present invention, the high-energy ion implanter comprises a tandem accelerator, a low-energy box, a high-energy box, gas sensors, and a controller.

The tandem accelerator includes an accelerating tank defining an accelerating space, a low-energy accelerator for accelerating negative ions at a first energy, a stripper for removing electrons from the negative ions by using a charge exchanging gas such that the negative ions are converted into positive ions, a high-energy accelerator for accelerating the positive ions at a second energy, a turbo pump for cycling the charge exchanging gas to and from the stripper, and a dynamo for driving the turbo pump. The low-energy accelerator, stripper, and high-energy accelerator are disposed in series in the accelerating space.

The low-energy box is provided at a front end of the tandem accelerator, and supplies the negative ions to the low-energy accelerator. The high-energy box is provided at a rear end of the tandem accelerator, and receives the positive ions from the high-energy accelerator. The gas sensors are provided in the low-energy box and the high-energy box, respectively, and measure the amount of the charge exchanging gas that leaks from the stripper into the low-energy box and the high-energy box. The controller is electronically coupled to the gas sensors, receives data from the gas sensors on the amount of charge exchanging gas in the energy boxes, and compares the measured data with standard data on the charge exchanging gas.

The standard data on the charge exchanging gas may be based on the conditions that prevail when the turbo pump is operating normally. The operating parameters of the turbo pump may include current, frequency and temperature. The controller may trigger a pre-established interlock to break off the operation of the implanter when the measured data is different from the standard data. The controller may be a host computer. Furthermore, each of the low-energy box and the high-energy box may also contain a high level vacuum gauge for measuring the vacuum pressure therein.

DETAILED DESCRIPTION OF THE PREFERRED EMBODIMENTS

The present invention will now be described more fully hereinafter with reference to the accompanying drawings. However, for the sake of clarity, well-known structures and processes will be not described or illustrated in detail. Furthermore, some elements described in detail in the background section will not be described again.

Figure 1:
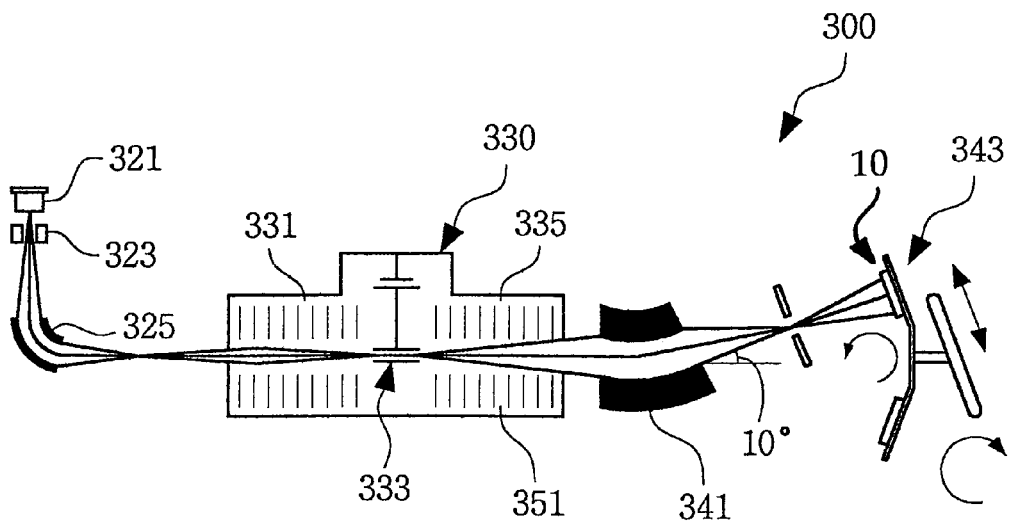
FIG. 1 is a schematic diagram of a conventional high-energy ion implanter.
Figure 2:
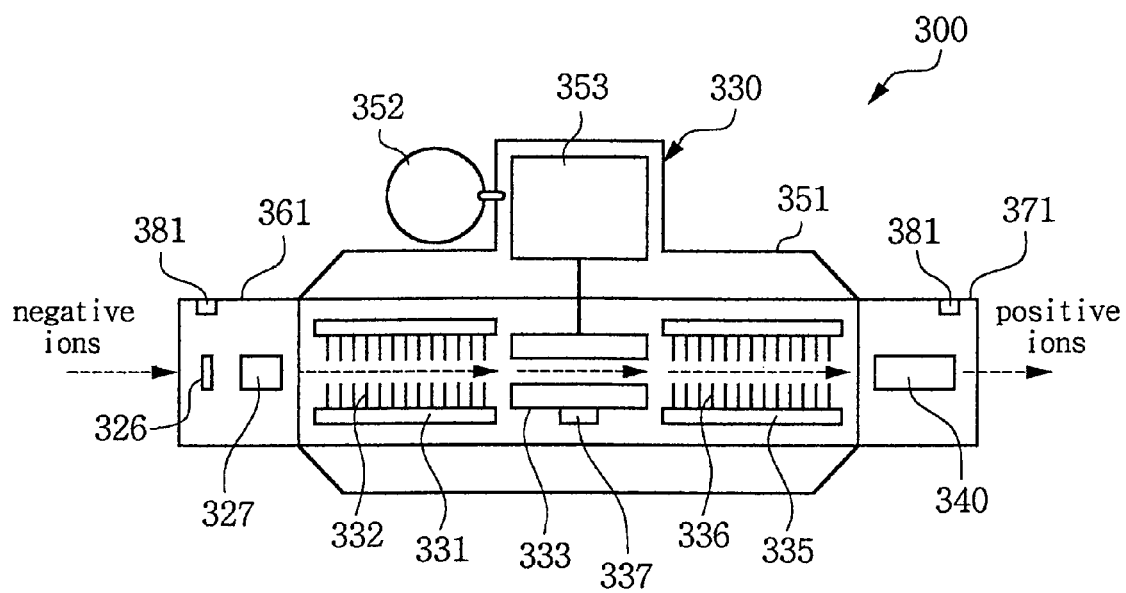
FIG. 2 is a schematic diagram of a tandem accelerator of the conventional high-energy ion implanter.
Figure 3:
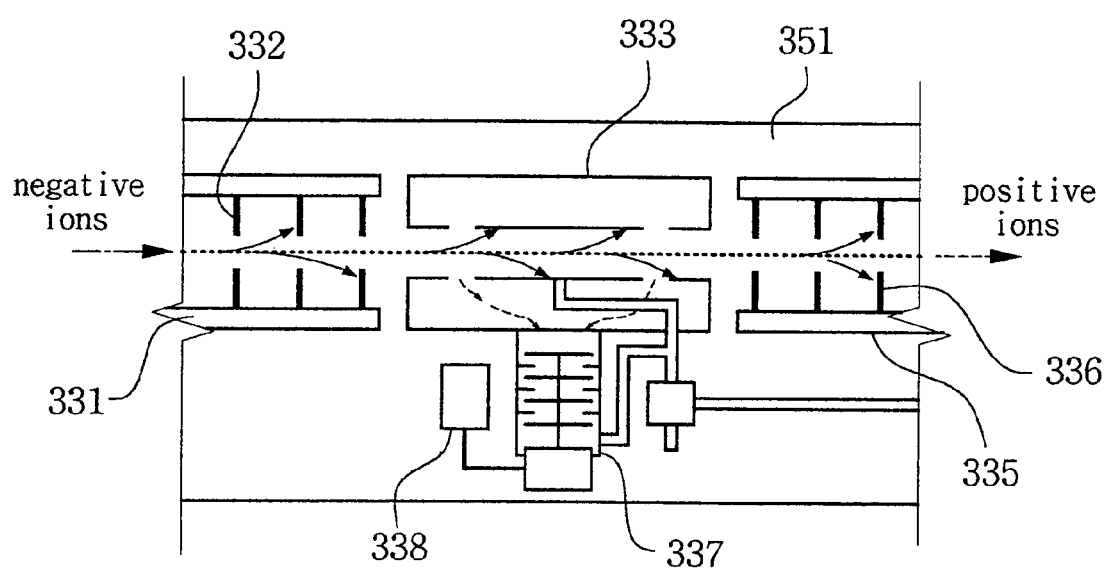
FIG. 3 is an enlarged view of a stripper of the tandem accelerator shown in FIG. 2.
Figure 4:
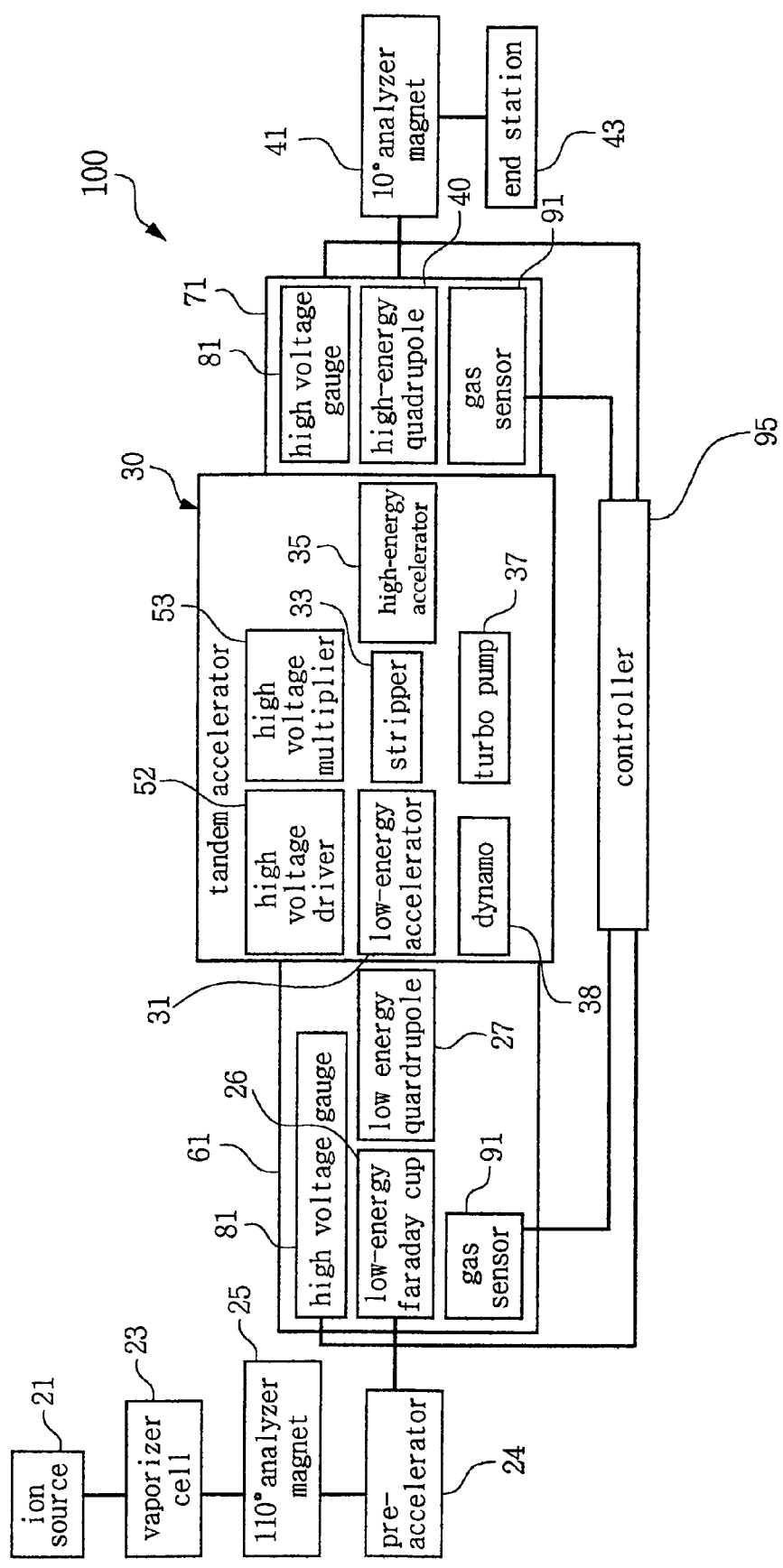
FIG. 4 is a block diagram of a high-energy ion implanter in accordance with the present invention.
Figure 5:
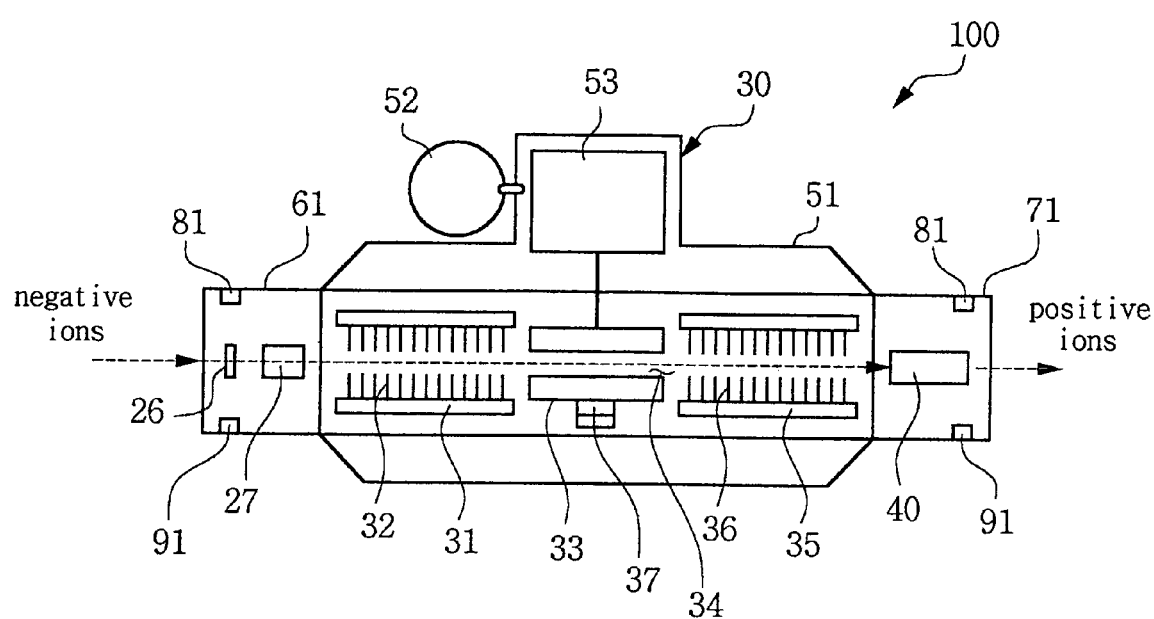
FIG. 5 is a schematic diagram of a portion of the high-energy ion implanter shown in FIG. 4, which includes a tandem accelerator of the implanter.

Referring to FIGS. 4 and 5, the high-energy ion implanter 100 includes a tandem accelerator 30 in which gas sensors 91 are provided. An ion source 21, a vaporizer cell 23, a 110° analyzer magnet 25, and a pre-accelerator 24 are provided at the front end of the tandem accelerator 30. A 10° analyzer magnet 41 and an end station 43 are provided at the rear (downstream) end of the tandem accelerator 30. A controller 95 regulates the above-mentioned respective elements.

The tandem accelerator 30 has a low-energy accelerator 31, a stripper 33, and a high-energy accelerator 35 that are arranged in series within an accelerating tank 51. A high voltage driver 52 and a high voltage multiplier 53 are provided in the upper portion of the tandem accelerator 30 in order to impress a high voltage across the stripper 33. The low-energy accelerator 31 and the high-energy accelerator 35, disposed on both sides of the stripper 33, each have a tubular body and a series of electrodes 32, 36 that protrude radially inwardly from the tubular body. Negative ions are accelerated at a first energy in the low-energy accelerator 31, and then converted into positive ions in the stripper 33. The positive ions are accelerated again at a second energy in the high-energy accelerator 35. The voltage that is applied to the tandem accelerator 30 may be about 650 keV or about 750 keV.

In the tandem accelerator 30, charge exchanging gas such as $N_2$ or Ar is supplied to the central portion of a canal 34 of the stripper 33, and then withdrawn from the canal 34 at the ends of the canal 34. A recycling of the charge exchanging gas in this way is performed by the pumping operation of a turbo pump 37 driven by a dynamo 38. The dynamo 38 is electrically coupled to the controller 95, so that information on the current, the temperature and the frequency of the dynamo 38 is input to the controller 95.

A low-energy box 61 and a high-energy box 71 are provided at the front end and rear end of the tandem accelerator 30, respectively. Each energy box 61 and 71 has a high level vacuum gauge 81 and a gas sensor 91. The high level vacuum gauge 81 measures the degree of vacuum in the energy box, and the gas sensor 91 detects the constituents of and the amount of gas in the energy box. The high level vacuum gauges 81 and the gas sensors 91 are electrically coupled to the controller 95.

The controller 95 regulates the operations of the elements of the ion implanter 100. Specifically, the controller 95 receives information on the operational states of the high vacuum gauges 81 and the turbo pump 37, and also controls the operations of the elements of the ion implanter according to the received information. In addition, the controller 95 receives data generated by the gas sensors 91 indicative of characteristics (e.g. amount and/or composition) of the gas in the low-energy and high-energy boxes 61 and 71, and compares the data with the standard data of the charge exchanging gas. The standard data is representative of a normal operation of the tandem accelerator. If the comparison indicates a malfunction in the operation of the ion implanter, an interlocking system breaks off the operation. The controller 95 may be a host computer. The comparison executed by the controller 95 may be made by executing software in the host computer. In particular, the standard data is preferably based on the constituents of the gas present during a normal operation of the turbo pump 37, the normal operation occurring according to preset parameters such as the current, the frequency and the temperature of the turbo pump 37.

The following is a description of the ion implantation procedure. After passing through the ion source 21, the vaporizer cell 23, the 110° analyzer magnet 25, and the pre-accelerator 24, the negative ions are supplied to the low-energy accelerator 31 through the low-energy box 61. The negative ions are accelerated in the low-energy accelerator 31 and then are drawn to the stripper 33. In the stripper 33, the negative ions collide with the charge exchanging gas supplied by the turbo pump 37, whereby electrons are removed from the negative ions such that the negative ions are converted into positive ions. Then the positive ions are accelerated in the high-energy accelerator 35. The ion beam of the accelerated positive ions is focused in the high-energy box 71, passes through the 10° analyzer magnet 41, and is injected into a wafer located at the end station 43.

In addition to supplying the charge exchanging gas to the central portion of a canal 34 of the stripper 33, the turbo pump 37 withdraws the charge exchanging gas from ends of the canal 34 and thereby circulates the charge exchanging gas through the stripper. If the turbo pump 37 is operating improperly, the charge exchanging gas is not recycled properly. In this respect, a major malfunction of the turbo pump 37 may be sensed by monitoring the current, the temperature and the frequency of the turbo pump 37 or by measuring a variation in vacuum pressure in the low-energy and high-energy boxes using the vacuum gauges 81. In this case, a command by the controller 95 orders the interlocking system to breaks off the operation of the implanter.

On the other hand, when the malfunction of the turbo pump 37 is minor, the sensed operating conditions of the turbo pump or the vacuum pressure in the energy boxes 61 and 71 may be insufficient indicators of such a minor malfunction. In this case, the charge exchanging gas may nonetheless still flow into both the low-energy box 61 and the high-energy box 71 through the respective accelerators 31 and 35, and thereby affect the vacuum conditions in the boxes. In such a case, the gas sensors 91 sense the presence of the charge exchanging gas. Then related information is transmitted to the controller 95, and the interlocking system is commanded to break off the operation off the ion implanter. Such sensing action of the gas sensors 91 may be performed continuously or intermittently at regular intervals.

The gas sensors 91, together with the controller 95, may constitute a residue gas analysis system. In this system, the gas sensors 91 measure the amounts of the charge exchanging gas that leak from the stripper 33 into the low-energy box 61 and the high-energy box 71. Data representative of such amounts is sent to the controller 95 and compared with the standard data on the charge exchanging gas, i.e., the characteristics of the gas prevailing in the system during a normal operation. This standard data may take into account the conditions existing under various normal operational parameters of the turbo pump 37. That is, the standard data on the charge exchanging gas takes into account the current, frequency and temperature at which the turbo pump operates during the normal state. When the measured data is different from the standard data, the controller 95 may command the pre-established interlocking system to break off the operation of the implanter.

Finally, although the present invention has been particularly shown and described with reference to the preferred embodiments thereof, it will be understood by those skilled in the art that various changes in form and details may be made thereto without departing from the true spirit and scope of the invention as defined by the appended claims.

What is claimed is:

1. A high-energy ion implanter comprising:
a tandem accelerator including an accelerating tank defining an accelerating space, a low-energy accelerator that accelerates negative ions at a first energy, a stripper in which a charge exchanging gas removes electrons from negative ions so as to convert the negative ions into positive ions, a high-energy accelerator that accelerates the positive ions at a second energy, a turbo pump connected to the stripper so as to circulate the charge exchanging gas through the stripper, and a dynamo connected to the turbo pump so as to drive the turbo pump, said low-energy accelerator, stripper and high-energy accelerator being disposed in series in said accelerating space;
a low-energy box disposed at a front end of the tandem accelerator, and through which the negative ions are supplied to the low-energy accelerator;
a high-energy box disposed at the rear end of the tandem accelerator so as to receive the positive ions from the high-energy accelerator;
gas sensors disposed, respectively, in the low-energy box and the high-energy box, and operative to measure the amount of gas in the low-energy box and the high-energy box, and to detect the constituents of the gas in the low-energy box and the high-energy box, respectively; and
a controller electrically coupled to the gas sensors so as to receive therefrom data indicative of the amounts and constituents of gas in said low-energy and high-energy boxes, and operative to compare said data with standard data on the charge exchanging gas.

2. The high-energy ion implanter of claim 1, and further comprising an interlocking system, operatively connected to said controller, so as to break off the operation of the implanter when the measured data is different from the standard data.

3. The high-energy ion implanter of claim 1, wherein the controller is a host computer.

4. The high-energy ion implanter of claim 1, and further comprising a respective vacuum gauge disposed in each of the low-energy box and the high-energy box further so as to measure the vacuum pressure therein.

5. The high-energy ion implanter of claim 1, and further comprising a quadrupole lens disposed in said high-energy box.

6. The high-energy ion implanter of claim 1, and further comprising a quadrupole and a faraday cup disposed in said low-energy box.

7. A method of operating a high-energy implanter having a tandem accelerator, said method comprising:
   introducing ions into the tandem accelerator through a low-energy box disposed at a front end of the tandem accelerator;
   accelerating negative ions at a first energy in the tandem accelerator;
   drawing the accelerated negative ions into a stripper in the tandem accelerator, and introducing a charge exchanging gas into the stripper, whereby the charge exchanging gas collides with the negative ions and thereby removes electrons from the negative ions to convert the negative ions into positive ions;
   accelerating the positive ions within a high-energy box disposed at a rear end of the tandem accelerator;
   monitoring the low-energy box and the high-energy box for the presence of the charge-exchanging gas in the boxes, and generating data representative of the amount of the gas and the constituents of the gas in the low-energy and high-energy boxes; and
   comparing the data with standard data on the charge exchanging gas.

8. The method of operation of claim 7, and further comprising circulating the charge exchanging gas through the stripper using a turbo pump.

9. The method of operation of claim 8, wherein the standard data on the charge exchanging gas is representative of the gas during a normal state of operation of the turbo pump.

10. The method of operation of claim 9, wherein the standard data takes into account the current, frequency and temperature at which the turbo pump operates during the normal state.

* * * * *